United States Patent
Mueller et al.

(10) Patent No.: US 9,230,798 B2
(45) Date of Patent: Jan. 5, 2016

(54) SEMICONDUCTOR WAFER COMPOSED OF SILICON AND METHOD FOR PRODUCING SAME

(71) Applicant: SILTRONIC AG, Munich (DE)

(72) Inventors: Timo Mueller, Burghausen (DE); Michael Gehmlich, Weissenborn (DE); Frank Faller, Dresden (DE); Dirk Waehlisch, Meissen (DE)

(73) Assignee: SILTRONIC AG, Munich (DE)

( * ) Notice: Subject to any disclaimer, the term of this patent is extended or adjusted under 35 U.S.C. 154(b) by 0 days.

(21) Appl. No.: 14/703,932

(22) Filed: May 5, 2015

(65) Prior Publication Data

US 2015/0325433 A1  Nov. 12, 2015

(30) Foreign Application Priority Data

May 9, 2014  (DE) .......... 10 2014 208 815

(51) Int. Cl.

| H01L 21/00 | (2006.01) |
| --- | --- |
| H01L 21/02 | (2006.01) |
| H01L 21/322 | (2006.01) |
| H01L 21/304 | (2006.01) |
| H01L 29/36 | (2006.01) |

(52) U.S. Cl.
CPC .... *H01L 21/02255* (2013.01); *H01L 21/02002* (2013.01); *H01L 21/02005* (2013.01); *H01L 21/02019* (2013.01); *H01L 21/02332* (2013.01); *H01L 21/304* (2013.01); *H01L 21/3225* (2013.01); *H01L 29/36* (2013.01)

(58) Field of Classification Search
CPC .............. H01L 21/02002; H01L 21/02005
See application file for complete search history.

(56) References Cited

U.S. PATENT DOCUMENTS

| 2004/0053516 A1 | 3/2004 | Nakada et al. |
| 2005/0054124 A1 | 3/2005 | Mun et al. |
| 2010/0038755 A1* | 2/2010 | Park ............... H01L 21/3225 257/617 |
| 2014/0044945 A1 | 2/2014 | Mueller et al. |
| 2014/0134779 A1* | 5/2014 | Kadono ........... H01L 21/02381 438/73 |
| 2014/0141537 A1* | 5/2014 | Falster ............. H01L 21/324 438/5 |

* cited by examiner

*Primary Examiner* — Ngan Ngo
(74) *Attorney, Agent, or Firm* — Brooks Kushman P.C.

(57) ABSTRACT

Monocrystalline silicon semiconductor wafers have a front side and a rear side, and a denuded zone which extends from the front side to the rear side as far as a depth which between a center and an edge of the semiconductor wafer on average is not less than 8 μm and not more than 18 μm, and having a region adjoining the denuded zone having BMDs whose density at a distance of 30 μm from the front side is not less than $2 \times 10^9$ cm$^{-3}$. The semiconductor wafers are produced by a method comprising providing a substrate wafer of monocrystalline silicon and an RTA treating the substrate wafer, the treatment subdivided into a first thermal treatment of the substrate wafer in an atmosphere consisting of argon and into a second thermal treatment of the substrate wafer in an atmosphere consisting of argon and ammonia.

20 Claims, 2 Drawing Sheets

SEMICONDUCTOR WAFER COMPOSED OF SILICON AND METHOD FOR PRODUCING SAME

CROSS-REFERENCE TO RELATED APPLICATIONS

This application claims priority to German Patent Application No. DE 102014208815.1 filed May 9, 2014 which is herein incorporated by reference.

BACKGROUND OF THE INVENTION

1. Field of the Invention

The invention relates to a semiconductor wafer composed of monocrystalline silicon having a front side and having a rear side and having a denuded zone, which extends from the front side in the direction of the rear side, and having a region which adjoins the denuded zone and has a specific density of BMDs. BMDs (bulk micro defects) are precipitates of oxygen in the monocrystalline environment, so-called oxygen precipitates. The invention also relates to a method for producing the semiconductor wafer.

2. Description of the Related Art

A denuded zone is an area of the semiconductor wafer which encompasses the front side and, owing to its lack of defects, is well suited as an environment for the construction of electronic structures. A region having BMDs which adjoins a denuded zone is held in high regard because oxygen precipitates act as getter centers that keep impurities away from the denuded zone.

A denuded zone is usually produced by thermal treatment of a substrate wafer at high temperatures. An RTA treatment is particularly suitable, that is to say a thermal treatment referred to as rapid thermal anneal, since in the course thereof the substrate wafer is heated to a target temperature at a high rate of temperature rise and is cooled after a comparatively short time at a high rate of temperature reduction. The time expenditure for producing the denuded zone by means of an RTA treatment is comparatively short.

If the RTA treatment is carried out in a nitriding atmosphere, this fosters the formation of oxygen precipitates in proximity to the denuded zone, since vacancies are injected in the course of the nitriding and incite the nucleation of oxygen precipitates. A mixture of argon and ammonia is particularly suitable as an RTA atmosphere, since the target temperature of the RTA treatment can thus also be reduced in a range in which the frequency of occurrence of slip is significantly reduced. A corresponding method is described in US 2004/0053516 A1, for example.

An appropriate source of the substrate wafers required are single crystals composed of silicon, in particular, which were pulled in accordance with the CZ method. In this method, silicon is melted in a crucible composed of quartz and the single crystal grows at the end of a seed crystal which is dipped into the resultant melt and is raised. The crucible material is partly dissolved by the melt and in this way provides oxygen that is required later for forming oxygen precipitates in the substrate wafer.

Specific defects, the formation of which depend in particular on the ratio V/G during the production of the single crystal, make it more difficult to form a denuded zone or prevent a denuded zone from being formed. If the ratio V/G of pulling rate V and axial temperature gradient at the interface between melt and growing single crystal during the production of the single crystal is between a lower threshold and an upper threshold, the formation of such defects does not happen. The defect formation is caused by a specific supersaturation of point defects which is not achieved under the conditions mentioned. If the ratio V/G is somewhat greater than the lower threshold, silicon interstitials are dominant, and if the ratio is somewhat less than the upper threshold, vacancies are dominant as point defect type. Overall, three zones can be differentiated in which no harmful supersaturation of point defects prevails. The [Pi] zone, which is dominated by silicon interstitials, the [Pv] zone, which is dominated by vacancies, and the OSF zone, which is dominated by vacancies and in which stacking faults can form after oxidation in oxygen.

It is complex and not very economic to produce single crystals from which substrate wafers are obtained which consist completely of only one of the zones mentioned. In order to achieve that, the ratio V/G is permitted to fluctuate only within very narrow limits. These limits are easily exceeded, since the ratio V/G is usually not constant along the phase boundary. Therefore, it is more economic to utilize the corridor between the lower and upper thresholds to the furthest possible extent. A single crystal that is pulled under such conditions generally yields substrate wafers comprising a [Pi] zone and a [Pv] zone.

The inventors subjected substrate wafers having these properties to an RTA treatment under a mixture of argon and ammonia and established that there are considerable differences regarding the depth of the denuded zone between the center and the edge of the substrate wafer. Such an inhomogeneous radial course is unfavorable, particularly for applications in which the semiconductor wafer is ground back in the course of further processing to form electronic components. If the denuded zone extends too deeply into the interior of the semiconductor wafer, it can happen that the region in which the oxygen precipitates are formed is completely removed during back grinding. The semiconductor wafer then lacks the necessary getter centers. The inventors furthermore established that the density of the oxygen precipitates increases only moderately in the direction toward the center plane of the semiconductor wafer. The center plane of the semiconductor wafer is the virtual plane between the front side and the rear side of the semiconductor wafer. During back grinding, therefore, it can happen that although a region with oxygen precipitates is maintained, the density of the oxygen precipitates in the region is too low to manifest a sufficient getter effect.

US 2005/0054124 A1 describes a method which comprises a two-stage RTA treatment and makes accessible a semiconductor wafer having a denuded zone, the depth of which from the center as far as the edge is relatively constant. Furthermore, the semiconductor wafer has a region which adjoins the denuded zone and has a density of oxygen precipitates that is virtually constant in the direction toward the center plane of the semiconductor wafer.

SUMMARY OF THE INVENTION

It is an object of the present invention to provide a semiconductor wafer and a method for producing same which has advantages in particular with regard to the formation of oxygen precipitates in comparison with the cited prior art. These and other objects are accomplished by means of a semiconductor wafer composed of mono crystalline silicon having a front side and having a rear side and having a denuded zone, which extends from the front side to the rear side as far as a depth which between a center and an edge of the semiconductor wafer on average is not less than 8 μm and not more than 18 μm, and having a region which adjoins the denuded zone and has BMDs whose density at a distance of 30 μm from the front side is not less than $2 \times 10^9$ cm$^{-3}$.

DETAILED DESCRIPTION OF THE PREFERRED EMBODIMENT(S)

Figure 1:
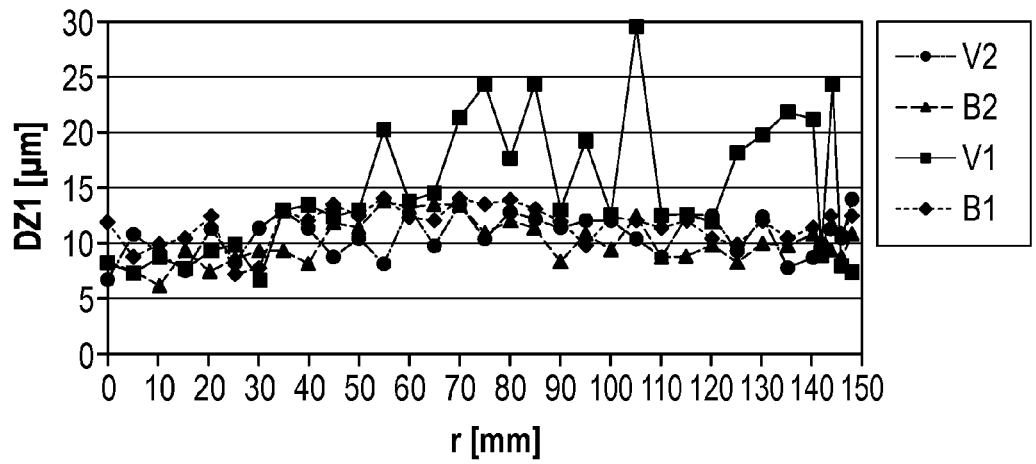
FIG. 1 shows the radial profile of the depth of the denuded zone on the basis of two examples (B1 and B2) and two comparative examples (V1 and V2). DZ1 denotes the averaged depth of the denuded zone at a specific radial position r between the center and the edge of the thermally treated substrate wafer.

Substrate wafers composed of monocrystalline silicon having a diameter of 300 mm were provided. Each of the substrate wafers contained interstitial oxygen in a concentration of $5.3 \times 10^{17}$ atoms/cm$^3$ and a zone extending outward from the center and dominated by vacancies and, adjoining said zone, a [Pi] zone extending to the edge of the substrate wafer and dominated by silicon interstitials. The substrate wafers in the polished state were subjected to an RTA treatment, which was carried out according to the invention in the case of the substrate wafers of the two examples. Comparative example V1 was configured such that the RTA treatment was performed without the first thermal treatment under otherwise identical conditions. Comparative example V2 was configured like examples B1 and B2, but with a longer duration of the first thermal treatment.

The semiconductor wafer is distinguished by a denuded zone having a homogeneous depth between the center and the edge of the semiconductor wafer. Furthermore, the density of the oxygen precipitates or of the nuclei thereof in the region adjoining the denuded zone rises rapidly in the direction toward the center plane of the semiconductor wafer and attains a peak density already near the boundary with respect to the denuded zone. The peak density of BMDs is preferably not less than $4 \times 10^9$ cm$^{-3}$, more preferably not less than $7 \times 10^9$ cm$^{-3}$. During the process of grinding back the semiconductor wafer to a residual thickness of 30 μm, the peak density of BMDs is not less than $2 \times 10^9$ cm$^{-3}$. The semiconductor wafer therefore has a region which adjoins the denuded zone and in which the density of BMDs rises rapidly in the depth direction. Owing to the availability of a high number of centers having a getter capability in direct proximity to the denuded zone, the region constitutes a so-called proximity getter.

Such a semiconductor wafer is produced by means of a method which comprises an RTA treatment that is subdivided.

The invention employs a method for producing a semiconductor wafer composed of monocrystalline silicon comprising providing a substrate wafer composed of monocrystalline silicon, which contains interstitial oxygen having a concentration of not less than $4.5 \times 10^{17}$ atoms/cm$^3$ and not more than $6.0 \times 10^{17}$ atoms/cm$^3$; an RTA treatment of the substrate wafer, which is subdivided into a first thermal treatment of the substrate wafer at a first temperature in a temperature range of not less than 1160° C. and not more than 1190° C. for a period of not less than 5 s and not more than 30 s, wherein at least a front side of the substrate wafer is exposed to an atmosphere consisting of argon, and into a second thermal treatment of the substrate wafer at a second temperature in the stated temperature range for a period of not less than 15 s and not more than 35 s, wherein at least the front side of the substrate wafer is exposed to an atmosphere consisting of argon and ammonia.

The substrate wafer provided comprises one or a plurality of zones in which silicon interstitials are dominant, but below a supersaturation that brings about the formation of dislocation loops. This zone is preferably a [Pi] zone. Such defects that form dislocation loops are also called A-defects, L-pit defects or dislocation clusters. Furthermore, the substrate wafer provided preferably comprises at least one zone in which vacancies are dominant, but below a supersaturation that brings about the formation of vacancy agglomerates. Defects based on the formation of such vacancy agglomerates are usually called COP defects, GOI defects or void defects. The zone dominated by vacancies and having the property mentioned is a [Pv] zone or an OSF zone.

It is particularly preferred if the substrate wafer comprises at least one [Pi] zone, at least one [Pv] zone or at least one [Pi] zone, at least one [Pv] zone and at least one OSF zone. Furthermore, the semiconductor wafer can also have a zone in which vacancies are dominant and GOI defects are present, provided that the density thereof is not more than 1 cm$^{-2}$.

The substrate wafer contains interstitial oxygen having a concentration of not less than $4.5 \times 10^{17}$ atoms/cm$^3$ and not more than $6.0 \times 10^{17}$ atoms/cm$^3$ with the use of the calibration factor in accordance with New ASTM. The oxygen concentration should not be less than $4.5 \times 10^{17}$ atoms/cm$^3$, in order that oxygen precipitates can arise in a sufficient number and size to manifest the getter effect striven for. The oxygen concentration should not be more than $6.0 \times 10^{17}$ atoms/cm$^3$, in order to prevent OSF defects from being formed in the OSF zone.

The concentration of interstitial oxygen in the single crystal is preferably set with the assistance of a horizontal magnetic field or of a CUSP magnetic field impressed on the melt held by the crucible.

The substrate wafer is preferably polished a first time before the RTA treatment. The polishing is preferably implemented as double side polishing, in the course of which the front side and the rear side of the substrate wafer are polished simultaneously. The material removal obtained in this case is preferably 10 to 30 μm per side. Such polishing after the RTA treatment is not recommendable, in principle, since the thickness of the denuded zone is thereby considerably reduced.

The substrate wafer is preferably treated before the RTA treatment with an oxidizing agent, in order to obtain on the front side of the substrate wafer a chemically produced oxide layer which is thicker than the thickness of a native oxide layer. The thickness of the chemically produced oxide layer is preferably 3 to 8 nm. The oxidizing agent is preferably ozone. The chemically produced oxide layer protects the front side from contamination during the RTA treatment and from the roughness of the front side increasing to an undesirable extent on account of the RTA treatment.

The RTA treatment of the substrate wafer comprises heating the substrate wafer to a temperature in a temperature range of not less than 1160° C. and not more than 1190° C., preferably to a temperature of 1175° C., and keeping the substrate wafer at this temperature during a first thermal treatment for a period of not less than 5 s and not more than 30 s. The duration of the first thermal treatment has a particular significance. The longer the duration, the greater will be the peak density of oxygen precipitates in the region which adjoins the denuded zone, and the faster the density of the oxygen precipitates will rise from the boundary with respect to the denuded zone in the direction toward the center plane of the substrate wafer. However, the duration should not be longer than 30 s, since with a longer duration the peak density of oxygen precipitates is again found further in the interior of the substrate wafer.

The substrate wafer is heated from a starting temperature, which is preferably in the range of 550° C. to 650° C., at a rate of temperature rise which is preferably not less than 50° C./s and not more than 95° C./s. A rate of temperature rise of 75° C./s is particularly preferred. The first thermal treatment is performed in such a way that the front side of the substrate wafer is exposed to a first atmosphere, which is an argon atmosphere. The first thermal treatment can be performed such that the rear side of the substrate wafer is also exposed to the first atmosphere. Alternatively, the rear side of the substrate wafer can be exposed to an atmosphere which differs from the argon atmosphere and is a nitrogen atmosphere, for example.

After the first thermal treatment, a second thermal treatment is carried out at a temperature in the stated temperature range of not less than 1160° C. and not more than 1190° C. and the substrate wafer is kept at this temperature for a period of not less than 15 s and not more than 35 s. It is preferred for the temperature of the substrate wafer during the first thermal treatment and the temperature of the substrate wafer during the second thermal treatment to be the same. Preferably, the RTA treatment is fashioned in such a way that the temperature of the substrate wafer does not leave the stated temperature range between the first and second thermal treatments. Keeping the substrate wafer in the stated temperature range between the two thermal treatments is advantageous because this prevents the substrate wafer from being exposed to relatively great temperature fluctuations. That protects the substrate wafer from formation of slip and from unfavorable influencing of the diffusion of point defects. The period between the first and second thermal treatments is preferably not more than 1 s.

The second thermal treatment is performed in such a way that the front side of the substrate wafer is exposed to a second atmosphere, which consists of a mixture of argon and ammonia. The second thermal treatment can be performed such that the rear side of the substrate wafer is also exposed to the second atmosphere. Alternatively, the rear side of the substrate wafer can be exposed to an atmosphere which differs from the second atmosphere and is a nitrogen atmosphere, for example.

In the second atmosphere, the ratio of argon:ammonia is preferably 10:1 to 10:20. The flow rate is preferably 5-25 slm.

After the second thermal treatment, the substrate wafer is cooled rapidly to a temperature of not more than 350° C. The rate of temperature reduction is preferably not less than 25° C./s and not more than 50° C./s. A rate of temperature reduction of 35° C./s is particularly preferred.

In the course of the second thermal treatment, a layer containing silicon oxynitride is produced on the front side of the substrate wafer. Said layer is preferably removed by etching. The etchant preferably used is an aqueous etchant containing not less than 0.5% by volume and not more than 1.5% by volume of hydrogen fluoride. The removal of the silicon oxynitride layer by means of haze-free polishing of the front side of the substrate wafer is not expedient, since this increases the roughness of the front side and generates particles.

It is also preferred to polish the edge of the substrate wafer before the etching of the substrate wafer. For the purpose of polishing the edge, the substrate wafer can be held at the front side or the rear side, for example by a suction device (chuck). The presence of the silicon oxynitride layer protects the surface of the substrate wafer from being damaged by defects in the course of the polishing of the edge, said defects being called PID (polishing induced defects).

After the etching of the substrate wafer, the front side of the substrate wafer is preferably polished a second time. The second polishing is preferably carried out as haze-free polishing, wherein only the front side is polished and the material removal is preferably not more than 0.5 µm.

The invention is explained further below on the basis of examples and with reference to drawings.

The substrate wafers of examples B1 and B2 and of comparative example V2 were heated to a temperature of 1175° C. at a rate of temperature rise of 75° C./s and were thermally treated (first thermal treatment) at this temperature in an atmosphere of argon for a duration of 15 s (example B1), 30 s (example B2), and 45 s (comparative example V2). Afterward, the second thermal treatment was carried out at the same temperature and without interim temperature change in an atmosphere of argon and ammonia in a ratio of 1:1 for the duration of 15 s. The substrate wafers were then cooled at a rate of temperature reduction of 35° C./s.

In order to detect the BMDs and their densities, the thermally treated substrate wafers were subjected to a precipitation thermal treatment, in the course of which BMDs present grow to a detectable size. The precipitation thermal treatment was carried out under nitrogen and comprised heating the substrate wafers firstly to a temperature of 780° C. over a period of 3 h and then to a temperature of 1000° C. over a period of 16 h. The BMD detection was carried out by means of laser light scattering at a fracture edge using a detection instrument of the MO441 type from the Raytex Corporation.

As is evident from FIG. 1, the radial profile of the depth of the denuded zone is significantly more inhomogeneous if the first thermal treatment is dispensed with (comparative example V1) than if the procedure according to the invention is adopted (examples B1 and B2).

Figure 2:
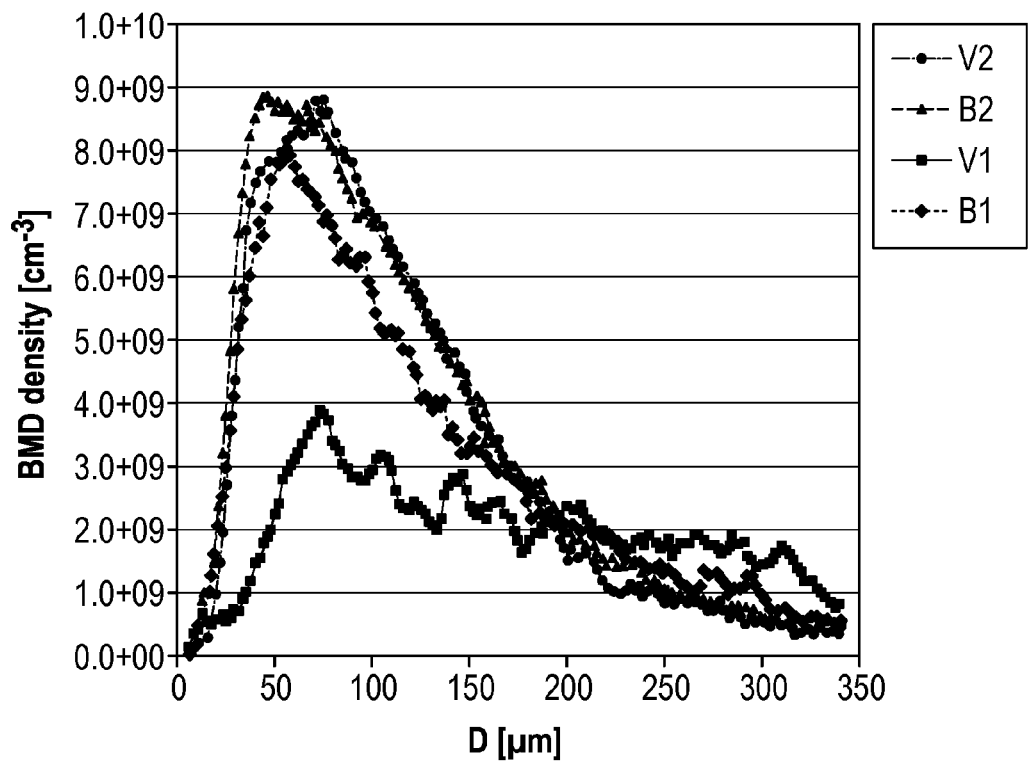
FIG. 2 shows, on the basis of the examples (B1 and B2) and the comparative examples (V1 and V2), the distribution of the density of BMDs as a function of their distance D from the front side of the thermally treated substrate wafer, wherein the distribution in the center of the substrate wafer of the respective example and comparative example is illustrated.

FIG. 2 shows that the peak density of BMDs is significantly lower if the first thermal treatment is dispensed with. Furthermore, the density of BMDs in the depth direction initially rises all the faster, the longer the duration of the first thermal treatment (examples B1 and B2). The peak density of BMDs likewise rises with the duration of the first thermal treatment. However, a duration of the first thermal treatment of 45 s is no longer advantageous, since the peak density of BMDs is found deeper within the substrate wafer (comparative example V2).

Figure 3:
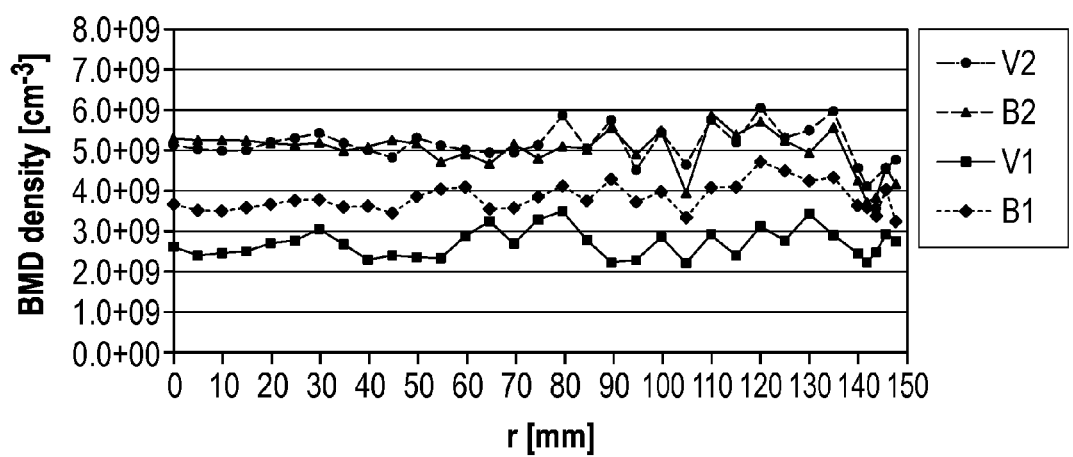
FIG. 3 shows, on the basis of the examples (B1 and B2) and the comparative examples (V1 and V2), the distribution of the density of BMDs as a function of the radial position r from the center of the thermally treated substrate wafer.

FIG. 3 reveals that the radial profile of the BMD density is at a significantly lower level if the first thermal treatment is dispensed with, and that the level is all the higher, the longer the duration of the first thermal treatment.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A monocrystalline silicon semiconductor wafer comprising a front side and a rear side, and a denuded zone which extends from the front side to the rear side as far as a depth which, between a center and an edge of the semiconductor wafer, is on average not less than 8 µm and not more than 18 µm, and having a region which adjoins the denuded zone and has BMDs whose density at a distance of 30 µm from the front side is not less than $2\times10^9$ cm$^{-3}$.

2. The semiconductor wafer of claim 1, wherein in the region which adjoins the denuded zone there is a peak density of BMDs which is not less than $4\times10^9$ cm$^{-3}$.

3. A method for producing a monocrystalline silicon semiconductor wafer of claim 1, having a front side and a rear side comprising:
provBiding a monocrystalline silicon substrate wafer containing interstitial oxygen at a concentration of not less than $4.5\times10^{17}$ atoms/cm$^3$ and not more than $6.0\times10^{17}$ atoms/cm$^3$;
RTA treating the substrate wafer by a treatment, which comprises a first thermal treatment of the substrate wafer at a first temperature in a temperature range of not less than 1160° C. and not more than 1190° C. for a period of not less than 5 s and not more than 30 s, wherein at least a front side of the substrate wafer is exposed to an atmosphere consisting of argon, and a second thermal treatment of the substrate wafer at a second temperature in the temperature range of not less than 1160° C. and not more than 1190° C. for a period of not less than 15 s and not more than 35 s, wherein at least the front side of the substrate wafer is exposed to an atmosphere consisting of argon and ammonia during said second thermal treatment.

4. The method of claim 3, wherein the substrate wafer is heated to the first temperature before the first thermal treatment at a rate of not less than 50° C./s and not more than 95° C./s and is cooled from the second temperature after the second thermal treatment at a rate of not less than 25° C./s and not more than 50° C./s.

5. The method of claim 3, wherein the atmosphere consisting of argon and ammonia has a ratio of argon to ammonia of not less than 10:20 and not more than 10:1.

6. The method of claim 4, wherein the atmosphere consisting of argon and ammonia has a ratio of argon to ammonia of not less than 10:20 and not more than 10:1.

7. The method of claim 3, wherein the second thermal treatment is performed within a period of not more than 1 s after the first thermal treatment and the temperature of the substrate wafer between the first and second thermal treatments remains in the temperature range of not less than 1160° C. and not more than 1190° C.

8. The method of claim 4, wherein the second thermal treatment is performed within a period of not more than 1 s after the first thermal treatment and the temperature of the substrate wafer between the first and second thermal treatments remains in the temperature range of not less than 1160° C. and not more than 1190° C.

9. The method of claim 5, wherein the second thermal treatment is performed within a period of not more than 1 s after the first thermal treatment and the temperature of the substrate wafer between the first and second thermal treatments remains in the temperature range of not less than 1160° C. and not more than 1190° C.

10. The method of claim 3, further comprising performing a double side polishing before the RTA treatment, in the course of which the front side and the rear side of the substrate wafer are polished simultaneously and a material removal of 10 to 30 µm is obtained on each side.

11. The method of claim 3, further comprising treating the substrate wafer before the RTA treatment with an oxidizing agent in order to obtain on the front side of the substrate wafer a chemically produced oxide layer which is thicker than the thickness of a native oxide layer.

12. The method of claim 4, further comprising treating the substrate wafer before the RTA treatment with an oxidizing agent in order to obtain on the front side of the substrate wafer a chemically produced oxide layer which is thicker than the thickness of a native oxide layer.

13. The method of claim 5, further comprising treating the substrate wafer before the RTA treatment with an oxidizing agent in order to obtain on the front side of the substrate wafer a chemically produced oxide layer which is thicker than the thickness of a native oxide layer.

14. The method of claim 7, further comprising treating the substrate wafer before the RTA treatment with an oxidizing agent in order to obtain on the front side of the substrate wafer a chemically produced oxide layer which is thicker than the thickness of a native oxide layer.

15. The method of claim 3, further comprising removing a silicon oxynitride layer from the front side of the substrate wafer after the RTA treatment by etching the substrate wafer using an aqueous etchant containing not less than 0.5% by volume and not more than 1.5% by volume of hydrogen fluoride.

16. The method of claim 4, further comprising removing a silicon oxynitride layer from the front side of the substrate wafer after the RTA treatment by etching the substrate wafer using an aqueous etchant containing not less than 0.5% by volume and not more than 1.5% by volume of hydrogen fluoride.

17. The method of claim 5, further comprising removing a silicon oxynitride layer from the front side of the substrate wafer after the RTA treatment by etching the substrate wafer using an aqueous etchant containing not less than 0.5% by volume and not more than 1.5% by volume of hydrogen fluoride.

18. The method of claim 7, further comprising removing a silicon oxynitride layer from the front side of the substrate wafer after the RTA treatment by etching the substrate wafer using an aqueous etchant containing not less than 0.5% by volume and not more than 1.5% by volume of hydrogen fluoride.

19. The method of claim 15, further comprising polishing an edge of the substrate wafer before removing the silicon oxynitride layer.

20. The method of claim 9, further comprising haze-free polishing the front side of the substrate wafer after the removal of the silicon oxynitride layer, wherein a material removal of not more than 0.5 µm is obtained.

* * * * *